United States Patent [19]

Gross, Jr. et al.

[11] Patent Number: 5,696,508

[45] Date of Patent: Dec. 9, 1997

[54] COMPARATOR-OFFSET COMPENSATING CONVERTER

[75] Inventors: George Francis Gross, Jr., Reading; Thayamkulangara Ramaswamy Viswanathan, Albany Township, both of Pa.

[73] Assignee: Lucent Technologies Inc., Murray Hill, N.J.

[21] Appl. No.: 393,741

[22] Filed: Feb. 24, 1995

[51] Int. Cl.$^6$ .............................. H03M 1/06; H03M 1/36
[52] U.S. Cl. ........................................ 341/118; 341/159
[58] Field of Search ................................. 341/118, 120, 341/155, 158, 159

[56] References Cited

U.S. PATENT DOCUMENTS

| | | | |
|---|---|---|---|
| 4,386,339 | 5/1983 | Henry | 340/347 |
| 4,400,693 | 8/1983 | Flamm | 341/118 |
| 4,539,551 | 9/1985 | Fujita et al. | 340/347 |
| 4,547,763 | 10/1985 | Flamm | 340/347 |
| 4,608,555 | 8/1986 | Hoeft | 340/347 |
| 4,639,715 | 1/1987 | Doluca | 340/347 |
| 4,763,106 | 8/1988 | Gulczynski | 340/347 |
| 4,794,374 | 12/1988 | Koike | 341/120 |
| 4,857,931 | 8/1989 | Gulczynski | 341/156 |
| 4,860,011 | 8/1989 | Colles | 341/133 |
| 5,099,241 | 3/1992 | Gulczynski | 341/159 |
| 5,119,098 | 6/1992 | Komatsu et al. | 341/159 |
| 5,138,319 | 8/1992 | Tesch | 341/156 |
| 5,194,867 | 3/1993 | Fisher | 341/159 |
| 5,206,649 | 4/1993 | Gulczynski | 341/156 |
| 5,214,430 | 5/1993 | Gulczynski | 341/120 |
| 5,218,362 | 6/1993 | Mayes et al. | 341/120 |
| 5,237,326 | 8/1993 | Jeong | 341/160 |
| 5,248,973 | 9/1993 | Babu et al. | 341/156 |
| 5,291,307 | 3/1994 | Luckhurst | 358/446 |

FOREIGN PATENT DOCUMENTS 62-183222  8/1987  Japan.

OTHER PUBLICATIONS

Analog–Digital Conversion Handbook, Third Edition, Prentice–Hall, Englewood cliffs, NJ 07632, Published by Prentice–Hall, pp. 218, 219, 355, 420–426.
Patent Abstracts of Japan, vol. 012, No. 026 (E–577), 26 Jan. 1988 & JP–A–86 023798 (Hitachi) 11 Aug. 1987, abstract.

*Primary Examiner*—Howard L. Williams
*Attorney, Agent, or Firm*—David L. Smith

[57] ABSTRACT

An integrated circuit for converting an analog signal to a digital signal includes a resistor string comprised of a plurality of serially coupled resistors coupled between a high voltage reference and a low voltage reference. Intermediate taps are defined at the junctions of the resistors in the resistor string. At least one comparator has first and second inputs and an output. The first input of the comparator is capable of being selectively coupled to preselected ones of the intermediate taps. The second input is capable of being switched between an unknown analog input in conversion mode and a predetermined tap that provides a nominal voltage at the second input in calibration mode. A selection circuit for sequencing through the preselected ones of the intermediate taps selects one of the preselected ones of the intermediate taps as a selected tap for compensating for the offset of the at least one comparator. The selection circuit stores the selected tap for subsequent use during operation of the circuit.

39 Claims, 4 Drawing Sheets

5,696,508

COMPARATOR-OFFSET COMPENSATING CONVERTER

TECHNICAL FIELD

This invention relates generally to analog-to-digital converters (ADC), and more particularly to such converters that compensate for comparator offset.

BACKGROUND OF THE INVENTION

ADC converters employing many comparators generating a thermometer code which can be decoded to binary output for high speed analog-to-digital conversion are referred to as flash converters. One input of each comparator of this type converter is connected to a unique reference voltage to which the input signal is to be compared. The number of unique reference voltages is usually equal to the number of comparators used. These unique reference voltages may be provided by a series resistor string coupled between a high reference voltage, and a low reference voltage that may be grounded. Unless a gain stage is provided, the difference between the high reference voltage and the low reference voltage should be equal to the maximum level that the input voltage to be converted can assume.

As integrated circuits move towards lower power, supply voltages decrease. As supply voltage decreases, the maximum voltage that can be converted also decreases as does the difference between the high reference voltage and the low reference voltage and the reference voltage developed across individual resistors representing a least significant bit (LSB) falls to within the offset voltage of comparators generating the thermometer code. When the offset voltage of a comparator is greater than one LSB a discontinuity occurs in the thermometer code developed a the collective outputs of the comparators. For the thermometer code to be meaningful, something must be done to overcome the comparator offset and restore thermometer code continuity.

One known technique provides for trim to match components in a comparator to reduce or eliminate comparator offset. Trimming occurs once at the time of production and, is thereafter fixed to the conditions that existed at the time of trim. Alternate techniques trade off speed of operation of the converter for area of silicon required to manufacture the converter. For one such technique, the array of comparators in a converter alternate between conversion operation and being offset nulled. This technique reduces the speed of conversion by the amount of time required for offset nulling. A variation on this technique provides a duplicate array of comparators in a converter such that the two arrays of comparators alternate in operation. While one array is being used for conversion the other array is being offset nulled. This variation requires a larger silicon area to accommodate the duplicate array of comparators and more power to operate the duplicate array of comparators.

What is desired is a technique to overcome comparator offset to provide a meaningful thermometer code without making a tradeoff with respect to speed, area of silicon, or power consumption.

SUMMARY OF THE INVENTION

In accordance with the present invention, an integrated circuit for converting an analog signal to a digital signal includes a resistor string comprised of a plurality of serially coupled resistors coupled between a high voltage reference and a low voltage reference. Intermediate taps are defined at the junctions of the resistors in the resistor string. At least one comparator has first and second inputs and an output. The first input of the comparator is capable of being selectively coupled to preselected ones of the intermediate taps. The second input is capable of being switched between an unknown analog input in conversion mode and a predetermined tap that provides a nominal voltage at the second input in calibration mode. A selection circuit for sequencing through the preselected ones of the intermediate taps selects one of the preselected ones of the intermediate taps as a selected tap for compensating for the offset of the at least one comparator. The selection circuit stores the selected tap for subsequent use during conversion operation of the circuit.

DETAILED DESCRIPTION

Figure 1:
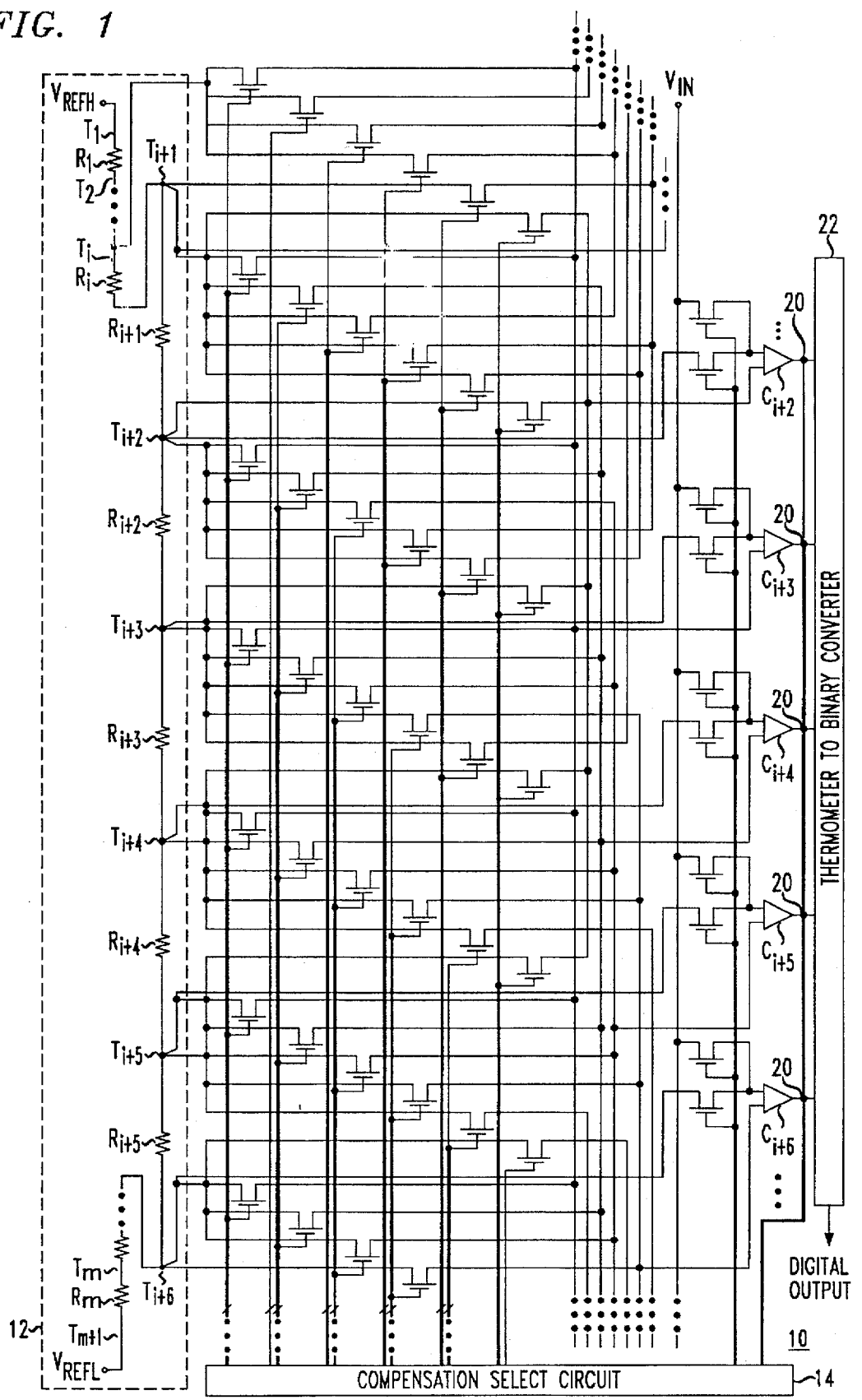
FIG. 1 is a schematic diagram of a analog-to-digital converter including comparator offset compensation in accordance with the present invention.

FIG. 1 shows a schematic diagram of an analog-to-digital converter 10 including comparator offset compensation in accordance with the present invention. The ADC includes a resistor string coupled between a high voltage reference, and a low voltage reference that is typically ground. Banks of switches, shown as MOS transistors, couple taps surrounding a nominal tap to a common input of a respective comparator. The other comparator input is switchable between the nominal tap when in calibration, and an unknown input voltage during conversion operation. The comparator outputs collectively provide a thermometer code that can be converted to any binary form to provide a digital output.

Resistor string 12 is comprised of a user determined number of resistors in series. The number of resistors, m, is typically $2^{n-1}$, where n is the number of bits of the converter. The resistors are thusly noted $R_1$ through $R_m$. The resistors may be of identical resistance. With a voltage applied across resistor string 12, a voltage gradient is developed across the resistor string and the same voltage drop, equal to one LSB, develops across each resistor in the string. The resistance values of the resistors comprising resistor string 12 are application dependent and can be readily selected by one skilled in the art based on a variety of parameters such as the power to be dissipated, the potential across the resistor string, and the number of resistors in the resistor string. The resistor string is coupled between a high voltage reference, $V_{REFH}$, and a low voltage reference, $V_{REFL}$, that may be grounded. Each resistor junction as well as each resistor-voltage source junction defines a tap $T_1$ through $T_{m+1}$. Switches, shown in the illustrative embodiment as MOS transistors, each couple a tap with an input of a respective comparator, $C_1$ through $C_m$.

Figure 2:
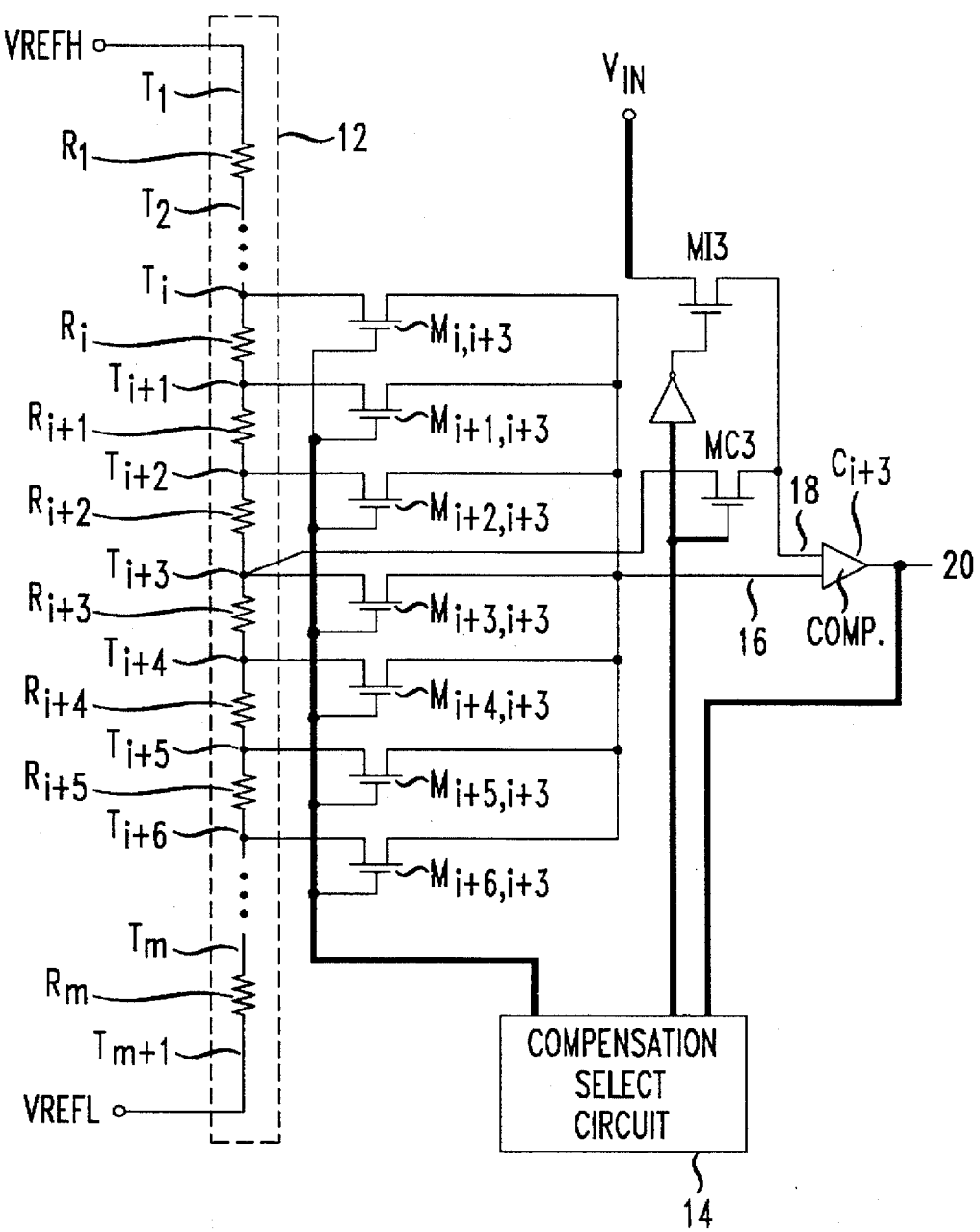
FIG. 2 is a schematic diagram of a portion of the schematic diagram of FIG. 1 showing the resistor string and a single comparator.

Operation of the offset compensation is best understood with reference to FIG. 2 in which a portion of the schematic diagram of FIG. 1 is illustrated. The nominal voltage, assuming no comparator offset voltage, to cause the output of a comparator $C_{i+3}$ to change state (i.e., the switching threshold) is the voltage at $T_{i+3}$ of resistor string 12. In the presence of offset in comparator $C_{i+3}$, the actual voltage to cause the output of comparator $C_{i+3}$ to change state may be higher or lower than the nominal voltage. Since the offset of any comparator C1 through $C_m$ is not known in advance, but the range of offset is known through experience in a given technology, allowance is made for the actual voltage that causes the comparator output to change state to be higher or lower than nominal voltage, within the range of offset. For example, a six bit flash converter having one volt across resistor string 12 is comprised of 63 identical resistors. Each resistor has a 15.6 millivolt drop across it representing one LSB. A flash converter typically has as many comparators as resistors. Typical offset range for a comparator is +50 millivolts thus, without some form of compensation, a thermometer code developed at the output of the comparators is meaningless. Since the offset voltage can range in the illustrative embodiment to approximately plus or minus three times (generally h times) the voltage of an LSB, having the capability to shift the input voltage to a comparator along the resistor string, up or down the equivalent of three LSB's, would compensate for the offset voltage of a comparator.

In accordance with the present invention, each comparator has first and second inputs 16 and 18, and an output 20 at which an output signal is presented. Input signals applied to inputs 16 and 18 are compared and the output indicates which is larger. While various conventions may be used, the illustrative embodiment will describe the output signal of a comparator as high when the input signal on input 18 is greater than the input signal on input 16.

Calibration of comparator $C_{i+3}$ is typical of the calibration of all comparators in converter 10. To calibrate comparator $C_{i+3}$, a voltage is impressed across resistor string 12. Compensation select circuit 14 turns transistor MI3 off to isolate input 18 of comparator $C_{i+3}$ from the unknown analog input voltage to be converted, $V_{IN}$, and turns transistor MC3 on to couple input 18 of comparator $C_{i+3}$ to the nominal voltage at tap $T_{i+3}$.

Compensation select circuit 14 is capable of switching various voltages along the resistor string to be the second input signal at second input 16. The number of voltages capable of being switched will vary, but typically will include voltages both greater than and less than the nominal voltage at tap $T_{i+3}$. In the illustrative embodiment, h voltages above nominal voltage, nominal voltage, and h voltages below nominal voltage, for a total of (2h+1) voltages or seven voltages can be independently switched to second input 16.

Switches $M_{i,i+3}$ through $M_{i+6,i+3}$ are systematically switched, one at a time, to couple associated tap voltages, $T_i$ through $T_{i+6}$, on resistor string 12 to be the input signal to second input 16. The tap voltages shown in the illustrative embodiment of FIGS. 1 and 2 are incremental LSB values, but the invention is not so limited. See for example FIG. 3. When sequencing through switches $M_{i,i+3}$ through $M_{i+6,i+3}$ from bottom to top (as shown in FIG. 2), the first switch associated with a tap voltage which cause comparator $C_{i+3}$ to change state from a one to a zero is considered to provide an input voltage that compensates for the offset of comparator $C_{i+3}$. Similarly, when sequencing through switches $M_{i,i+3}$ through $M_{i+6,i+3}$ from top to bottom, the first switch associated with a tap voltage which causes comparator $C_{i+3}$ to change state from a zero to a one is considered to provide an input voltage that compensates for the offset of comparator $C_{i+3}$. Other sequencing methods are possible. The switch that provides an input voltage that compensates for the offset of comparator $C_{i+3}$ remains closed and all other switches $M_{i,i+3}$ through $M_{i+6,i+3}$ remain open for this calibration. The address of the switch that couples a voltage that compensates for the offset of comparator $C_{i+3}$ is stored in memory, such as in compensation select circuit 14. The memory may be any type of memory including registers and flash memory.

Having completed compensation of comparator $C_{i+3}$, compensation select circuit 14 sequences to the next comparator and repeats the above process, storing in memory the address of the switch that couples an input voltage that compensates for the offset of the next comparator. This sequencing continues until compensation select circuit 14 has identified and stored the address of a switch to couple a voltage to each comparator that compensates for the offset voltage of that comparator.

One of ordinary skill in the art can develop logic to sequence through the comparators and the switches associated with each comparator to identify the switch that couples a voltage to compensate for the offset of each comparator, and to store the address of each such switch in a memory or register.

Figure 4:
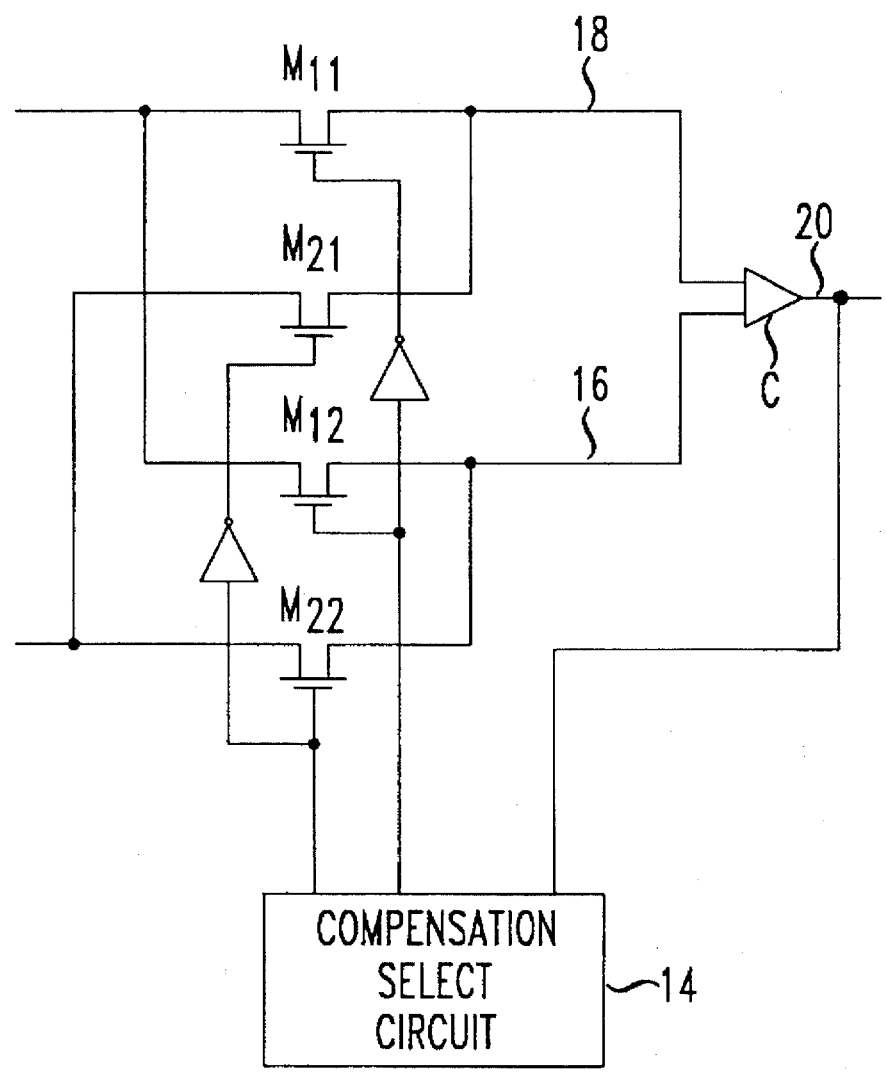
FIG. 4 is a schematic diagram showing two pairs of switches to reverse the inputs of a comparator.

The offset calibration can be continued to both ends of resistor string 12. For the first h comparators at the top of resistor string 12, this technique more readily compensates for comparator offset that is positive and for the last h comparators associated with resistors at the bottom of resistor string 12, this technique more readily compensates for comparator offset that is negative. To provide for the full 2h+1 voltages such that each comparator is compensated to within one LSB, it may be necessary to reverse the inputs to one or more of the top three and bottom three comparators. As is known in the art, the inputs to a comparator can be reversed using two pairs of switches as illustrated in FIG. 4. The pairs of switches, controlled by compensation select circuit 14, need only be supplied for the h comparators associated with resistors at the top of resistor string 12 and the h comparators associated with resistors at the bottom of resistor string 12. This technique could extend to all comparators.

Alternatively, the offset calibration can be extended to all comparators by extending the resistor string by h resistors at both ends and introducing a gain error that can be compensated for using known techniques.

The output 20 of each comparator is provided to compensation select circuit 14 and thermometer-to-binary converter 22. The collective outputs of the comparators are converted to any known binary form by thermometer to binary converter 22 for serial or parallel digital output as shown in FIGS. 1 and 3.

Figure 3:
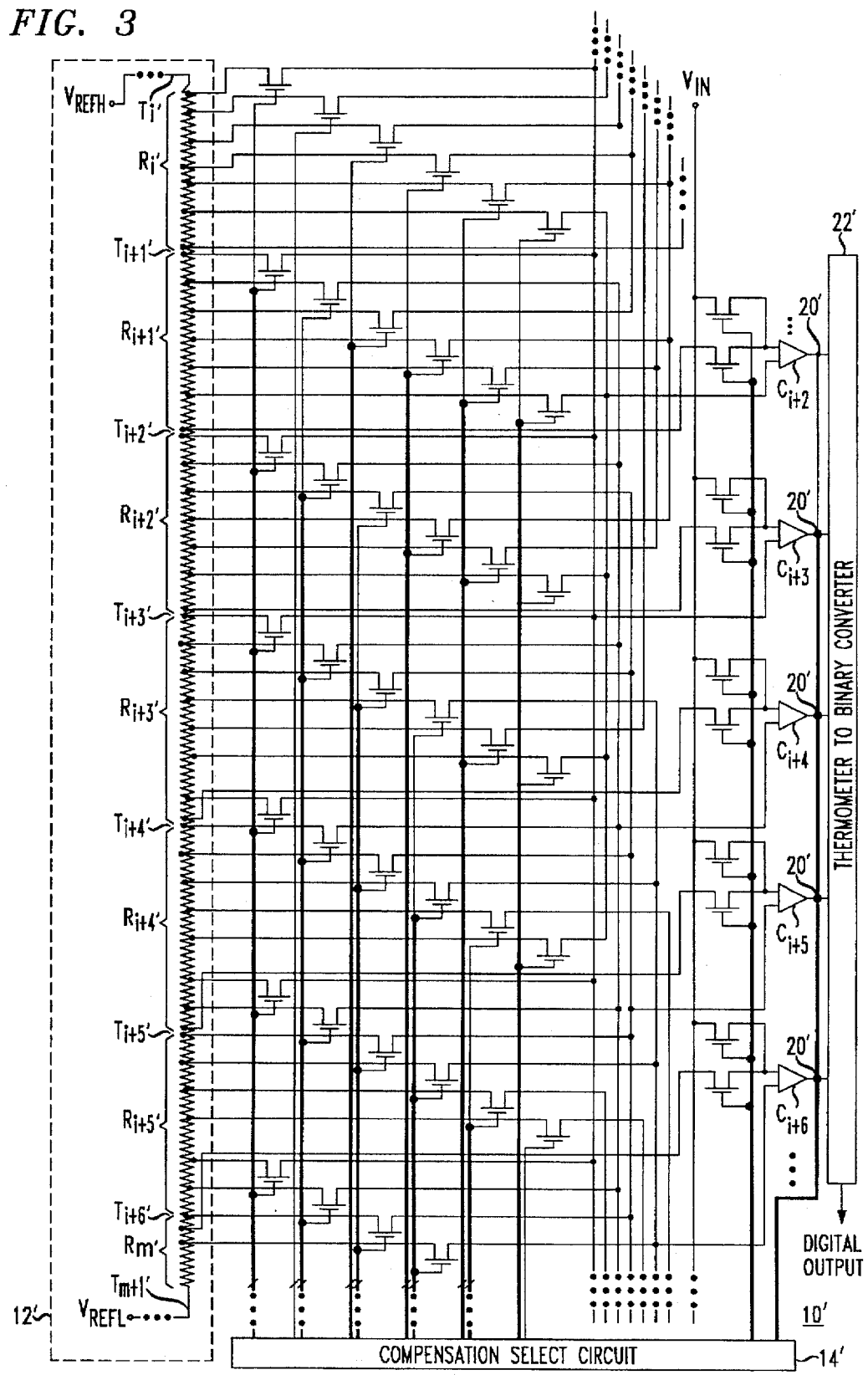
FIG. 3 is a schematic diagram of an analog-to-digital converter similar to FIG. 1, with the resistor string tapped at locations other than incremental least significant bit locations.

An alternate embodiment ADC 10' shown in FIG. 3 provides a distributed resistor string 12'. Adjacent taps are separated by less than one LSB. The preselected taps coupled through switches to a comparator are separated by one LSB.

While the illustrative embodiment of the invention has been described as coupling a single tap to the first input of a comparator, more than one tap may be coupled to the first input at the same time, resulting in an effective tap, in accordance with U.S. patent application Ser. No. 08/327174 filed Oct. 21, 1994, the disclosure of which is hereby incorporated by reference. Coupling more than one tap to the first input would occur such as when, the voltage drop across a resistor in the resistor string is greater than one LSB. The number of taps and which taps are coupled simultaneously to the first input of a comparator would depend on the incremental voltage drop required to obtain an LSB.

In an alternative embodiment, instead of using resistor string 12 to generate the nominal calibration voltages, an accurate voltage can be impressed on $V_{IN}$, with $V_{IN}$ coupled to input 18 of comparator $C_{i+3}$ by transistor MI3. Since the calibration voltage is provided by $V_{IN}$, in the alternate embodiment transistor MC3 need not be present. The remainder of the circuit in FIGS. 1 and 2 would remain and operate as described above. It is recognized that as many accurate voltages would be required as there are comparators, and the voltages would have to be at least as accurate as the number of bits it is desired to convert and the alternative embodiment could not as conveniently be recalibrated. Furthermore, the alternative embodiment compensates for both comparator offset and resistor string non-linearities.

The illustrative embodiment of the invention is particularly useful in integrate circuits that utilize this technique. Such integrated circuits have the advantages of high speed low power operation in a small area of silicon to provide offset compensation for comparators. Calibration as described above can occur at wafer test, can be user initiated, or can be initiated upon power-up of the converter. Factors that suggest the need for recalibration short term include changes in ambient temperature, and long term include degradation of an integrated circuit. As compensated, the switching thresholds of the comparators need not be more accurate than one LSB. At wafer test, on any chip that a switch can not be identified for each comparator to provide compensation, that chip can be discarded. Variations in the switch settings stored by compensation select circuit 14 of chips at wafer test is an inference that there is a change in the manufacturing process. When an integrated circuit is calibrated in the manner described above and at least one comparator is identified for which a switch can not be identified to provide offset compensation, an error flag may be set.

We claim:

1. An integrated circuit for converting an analog signal to a digital signal, comprising:
   a resistor string coupled between a high voltage reference and a low voltage reference, the resistor string comprising a plurality of serially coupled resistors;
   intermediate taps defined at the junctions of the resistors in the resistor string;
   at least one comparator, the at least one comparator having first and second inputs and an output, the first input of the comparator capable of being selectively coupled to preselected ones of the intermediate taps more than one tap at a time, the second input capable of being switched between an unknown analog input in operation mode and a predetermined tap that provides a nominal voltage at the second input in calibration mode; and
   a selection circuit for sequencing through the preselected one of the intermediate taps to select at least one of the preselected ones of the intermediate taps as a selected tap for compensating for the offset of said at least one comparator, the selection circuit for storing the selected tap for subsequent use in the conversion mode.

2. An integrated circuit as recited in claim 1, wherein the preselected ones of the intermediate taps the first input is capable of being selectively coupled to is an odd number.

3. An integrated circuit as recited in claim 1, wherein the preselected ones of the intermediate taps the first input is capable of being selectively coupled to includes said predetermined tap that provides a nominal voltage at the second input.

4. An integrated circuit as recited in claim 1, wherein the preselected ones of the intermediate taps the first input is capable of being selectively coupled to includes at least one tap in the resistor string above said predetermined tap that provides a nominal voltage at the second input.

5. An integrated circuit as recited in claim 1, wherein the preselected ones of the intermediate taps the first input is capable of being selectively coupled to includes at least one tap in the resistor string below said predetermined tap that provides a nominal voltage at the second input.

6. An integrated circuit as recited in claim 1, wherein the preselected ones of the intermediate taps the first input is capable of being selectively coupled to includes at least one tap in the resistor string above said predetermined tap, and at least one tap in the resistor string below said predetermined tap that provides a nominal voltage at the second input.

7. An integrated circuit as recited in claim 1, further comprising:
   a thermometer code scale circuit for receiving the output of said at least one comparator, the thermometer code scale circuit for converting the output of said at least one comparator to a binary output.

8. An integrated circuit as recited in claim 1, wherein the first input of the comparator is capable of being selectively coupled to preselected ones of the intermediate taps, one at a time.

9. An integrated circuit for converting an analog signal to a digital signal, comprising:
   a resistor string coupled between a high voltage reference and a low voltage reference, the resistor string comprising a plurality of serially coupled resistors;
   intermediate taps defined at the junctions of the resistors in the resistor string;
   a plurality of comparators, each of the comparators of the comparators having first and second inputs and an output, the first input of each of said plurality of comparators capable of being selectively coupled at the same time to more than one of several preselected taps associated with each comparator, the second input of each of said plurality of comparators capable of being switched between an unknown analog input in conversion mode and a predetermined tap that provides a nominal voltage at the second input in calibration mode; and
   a selection circuit for sequencing through the preselected taps to select at least one of the several preselected taps as a selected tap for compensating for the offset of each of said plurality of comparators, the selection circuit for storing the selected tap for each of the plurality of comparators for use in of the conversion mode.

10. An integrated circuit as recited in claim 9, wherein the preselected taps the first input is capable of being selectively coupled to is an odd number.

11. An integrated circuit as recited in claim 9, wherein the preselected taps the first input is capable of being selectively coupled to includes said predetermined tap that provides a nominal voltage at the second input.

12. An integrated circuit as recited in claim 9, wherein the preselected taps the first input is capable of being selectively coupled to includes at least one tap in the resistor string above said predetermined tap that provides a nominal voltage at the second input.

13. An integrated circuit as recited in claim 9, wherein the preselected taps the first input is capable of being selectively coupled to includes at least one tap in the resistor string below said predetermined tap that provides a nominal voltage at the second input.

14. An integrated circuit as recited in claim 9, wherein the preselected taps the first input is capable of being selectively coupled to includes at least one tap in the resistor string above said predetermined tap, and at least one tap in the resistor string below said predetermined tap that provides a nominal voltage at the second input.

15. An integrated circuit as recited in claim 9, further comprising:

a thermometer code circuit for receiving the output of said plurality of comparators, the thermometer code scale circuit for converting the output of said plurality of comparators to a binary output.

16. An integrated circuit for converting an analog signal to a digital signal, comprising:

a resistor string coupled between a high voltage reference and a low voltage reference, the resistor string comprising a plurality of serially coupled resistors;

intermediate taps defined at the junctions of the resistors in the resistor string;

at least one comparator, the at least one comparator having first and second inputs and an output, the first input of the at least one comparator capable of being selectively coupled to several preselected taps the first input of the at least one comparator capable of being selectively coupled at the same time to more than one of the several preselected taps, the second input of the at least one comparator capable of being switched between a reference voltage in calibration mode and an unknown analog input voltage in conversion mode;

a selection circuit for sequencing through the preselected taps to select at least one of the preselected taps as a selected tap for compensating for the offset of said at least one comparator, the selection circuit for storing the selected tap for use in the conversion mode.

17. An integrated circuit as recited in claim 16, wherein the preselected ones of the intermediate taps the first input is capable of being selectively coupled to is an odd number.

18. An integrated circuit as recited in claim 16, wherein the preselected ones of the intermediate taps the first input is capable of being selectively coupled to includes said predetermined tap that provides a nominal voltage at the second input.

19. An integrated circuit as recited in claim 16, wherein the preselected ones of the intermediate taps the first input is capable of being selectively coupled to includes at least one tap in the resistor string above said predetermined tap that provides a nominal voltage at the second input.

20. An integrated circuit as recited in claim 16, wherein the preselected ones of the intermediate taps the first input is capable of being selectively coupled to includes at least one tap in the resistor string below said predetermined tap that provides a nominal voltage at the second input.

21. An integrated circuit as recited in claim 16, wherein the preselected ones of the intermediate taps the first input is capable of being selectively coupled to includes at least one tap in the resistor string above said predetermined tap, and at least one tap in the resistor string below said predetermined tap that provides a nominal voltage at the second input.

22. An integrated circuit as recited in claim 16, further comprising:

a thermometer code scale circuit for receiving the output of said at least one comparator, the thermometer code scale circuit for converting the output of said at least one comparator to a binary output.

23. An integrated circuit as recited in claim 16, wherein the first input of the comparator is capable of being selectively coupled to preselected ones of the intermediate taps, one at a time.

24. An integrated circuit for converting an analog signal to a digital signal, comprising:

a resistor string coupled between a high voltage reference and a low voltage reference, the resistor string comprising a plurality of serially coupled resistors;

intermediate taps defined at the junctions of the resistors in the resistor string;

a plurality of comparators, each of the comparators having first and second inputs and an output, the first input of each of said plurality of comparators capable of being selectively coupled at the same time to more than one of several preselected taps associated with each of the comparators, the second input of each of the comparators capable of being switched between a reference voltage in calibration mode and an unknown analog input voltage in conversion mode; and a selection circuit for sequencing through the preselected taps to select at least one of the several preselected taps as a selected tap for compensating for the offset of each of the comparators, the selection circuit for storing the selected tap for each of the plurality of comparators for use in the conversion mode.

25. An integrated circuit as recited in claim 24, wherein the preselected taps the first input is capable of being selectively coupled to is an odd number.

26. An integrated circuit as recited in claim 24, wherein the preselected taps the first input is capable of being selectively coupled to includes said predetermined tap that provides a nominal voltage at the second input.

27. An integrated circuit as recited in claim 24, wherein the preselected taps the first input is capable of being selectively coupled to includes at least one tap in the resistor string above said predetermined tap that provides a nominal voltage at the second input.

28. An integrated circuit as recited in claim 24, wherein the preselected taps the first input is capable of being selectively coupled to includes at least one tap in the resistor string below said predetermined tap that provides a nominal voltage at the second input.

29. An integrated circuit as recited in claim 24, wherein the preselected taps the first input is capable of being selectively coupled to includes at least one tap in the resistor string above said predetermined tap, and at least one tap in the resistor string below said predetermined tap that provides a nominal voltage at the second input.

30. An integrated circuit as recited in claim 24, further comprising:

a thermometer code circuit for receiving the output of said plurality of comparators, the thermometer code scale circuit for converting the output of said plurality of comparators to a binary output.

31. An integrated circuit for converting an analog signal to a digital signal, comprising:

a resistor string coupled between a first terminal and a second terminal, the resistor string comprising a plurality of serially coupled resistors, the plurality of serially coupled resistors including at least first and second resistors;

intermediate taps defined at the junctions of the resistors in the resistor string;

at least one comparator, the at least one comparator having first and second inputs and an output, the first and second inputs to the comparator capable of being reversed such that either the first or second input of the comparator is selectively coupled to preselected ones of the intermediate taps while the other input is capable of being switched between an unknown analog input in operation mode and a predetermined tap that provides a nominal voltage at the other input in calibration mode.

32. An integrated circuit, as recited in claim 31, wherein the first and second inputs to said at least one comparator are reversed using two pairs of switches, the switches in the first pair of switches in series with the first and second inputs, the switches in the second pair of switches cross-coupled between the first and second inputs.

33. An integrated circuit as recited in claim 32, wherein the first pair of switches take on a first state when the second pair of switches take on a second state.

34. An integrated circuit as recited in claim 33, further comprising a control circuit for controlling the state of the first and second pairs of switches.

35. An integrated circuit as recited in claim 31, wherein said at least one comparator is coupled to an intermediate tap proximate the first terminal.

36. An integrated circuit as recited in claim 31, wherein said at least one comparator comprises first and second comparators coupled to intermediate taps proximate the first terminal.

37. An integrated circuit as recited in claim 31, wherein said at least one comparator comprises first and second comparators each having first and second inputs, the first input of the first comparator coupled to an intermediate tap proximate the first terminal and the first input of the second comparator coupled to an intermediate tap proximate the second terminal.

38. An integrated circuit as recited in claim 31, wherein the intermediate taps further comprise the first and second terminals.

39. An integrated circuit as recited in claim 38, wherein said at least one comparator comprises first and second comparators each having first and second inputs, the first input of the first comparator coupled to an intermediate tap proximate the first terminal and the first input of the second comparator coupled to an intermediate tap proximate the second terminal.

* * * * *